(12) United States Patent
Sawai et al.

(10) Patent No.: US 6,201,213 B1
(45) Date of Patent: *Mar. 13, 2001

(54) METHOD AND DEVICE FOR MACHINING A WIRING BOARD UTILIZING LIGHT SHIELDING OF A LASER BEAM TO SELECT A MACHINED TAPERING

(75) Inventors: Hidekazu Sawai; Miki Kurosawa; Masato Matsubara, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/821,934

(22) Filed: Mar. 21, 1997

(30) Foreign Application Priority Data

Oct. 1, 1996 (JP) ..................................................... 8-260847

(51) Int. Cl.[7] ................................................. B23K 26/06
(52) U.S. Cl. ................................. 219/121.71; 219/121.75
(58) Field of Search .......................... 219/121.6, 121.68, 219/121.69, 121.7, 121.71, 121.67, 121.72, 121.73, 121.74, 121.75, 121.85, 121.61

(56) References Cited

U.S. PATENT DOCUMENTS

| | | | | |
|---|---|---|---|---|
| Re. 33,947 | * | 6/1992 | Shinohara | 219/121.69 |
| 3,947,093 | * | 3/1976 | Goshima et al. | 219/121.6 |
| 4,734,550 | * | 3/1988 | Imamura et al. | 219/121.77 |
| 4,857,698 | * | 8/1989 | Perun | 219/121.71 |
| 5,017,755 | * | 5/1991 | Yahagi et al. | 219/121.68 |
| 5,119,550 | * | 6/1992 | Baughman et al. | 219/121.7 X |
| 5,237,148 | * | 8/1993 | Aoki et al. | 219/121.7 |
| 5,319,183 | * | 6/1994 | Hosoya et al. | 219/121.68 |
| 5,386,430 | * | 1/1995 | Yamagishi et al. | 219/121.6 |
| 5,486,546 | * | 1/1996 | Mathiesen et al. | 522/165 |
| 5,657,138 | * | 8/1997 | Lewis et al. | 219/121.73 |
| 5,670,069 | * | 9/1997 | Nakai et al. | 219/121.73 |
| 5,721,416 | * | 2/1998 | Burghardt et al. | 219/121.73 |

FOREIGN PATENT DOCUMENTS

| | | | | |
|---|---|---|---|---|
| 572798 | * | 2/1976 | (CH) | 219/121.73 |
| 0500110 | * | 8/1992 | (EP) | 219/121.71 |
| 63-40690 | * | 2/1988 | (JP) | 219/121.73 |
| 3-193289 | * | 8/1991 | (JP) . | |
| 4-66288 | * | 3/1992 | (JP) . | |
| 5-390 | * | 1/1993 | (JP) | 219/121.73 |
| 5-147213 | * | 6/1993 | (JP) . | |
| 6-79488 | * | 3/1994 | (JP) | 219/121.75 |
| 6-269969 | * | 9/1994 | (JP) . | |
| 07100685 | | 4/1995 | (JP) . | |
| 07193374 | | 7/1995 | (JP) . | |
| 7-214360 | * | 8/1995 | (JP) . | |
| 07284976 | | 10/1995 | (JP) . | |
| 93/15911 | * | 8/1993 | (WO) . | |

* cited by examiner

Primary Examiner—Samuel M. Heinrich
(74) Attorney, Agent, or Firm—Sughrue, Mion, Zinn, Macpeak & Seas, PLLC

(57) ABSTRACT

A wiring board is machined by providing a light shielding body for shielding a portion of a laser beam in a light path between a laser oscillator and a machining lens, irradiating the laser beam onto the light shielding body, and introducing a non-shielded portion of the laser beam having passed through the light shielding body to the machining lens.

1 Claim, 15 Drawing Sheets

TO f-θ LENS

FIG.2B

TO f-θ LENS

TO f-θ LENS

FIG.4C

TO f-θ LENS

MULTI-MODE

WATER

METHOD AND DEVICE FOR MACHINING A WIRING BOARD UTILIZING LIGHT SHIELDING OF A LASER BEAM TO SELECT A MACHINED TAPERING

FIELD OF THE INVENTION

The present invention relates to a method for machining a wiring board with a laser beam for piercing holes such as a through hole, an inner-via hole, and a blind-via hole or the like in a wiring board which is so-called a printed board as well as a device for the same, and more particularly to a method for machining a wiring board with a laser beam for changing the converging characteristic thereof as well as a device for the same.

BACKGROUND OF THE INVENTION

Figure 14:
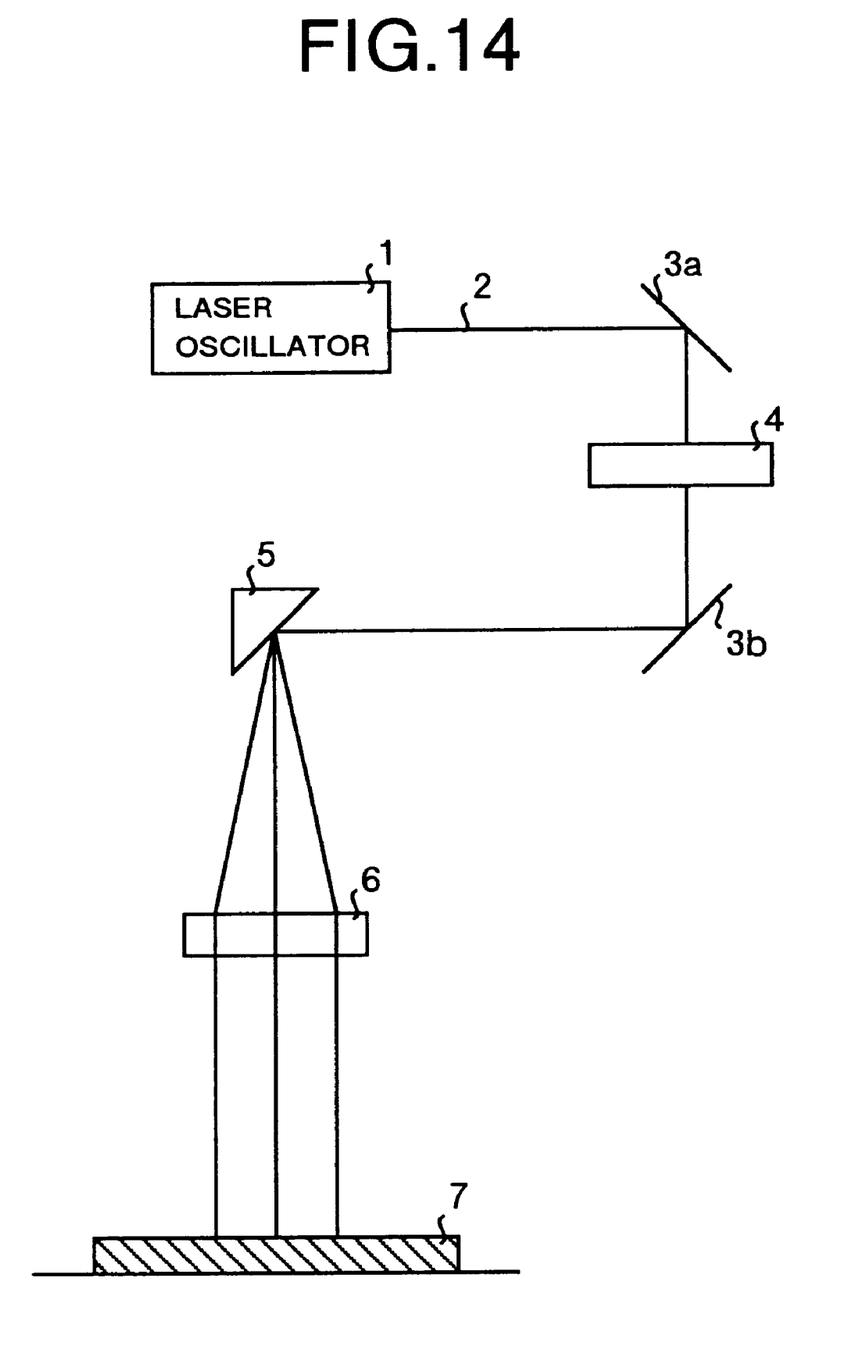
FIG. 14 is a diagrammatic view illustrating an example of the conventional technology.

FIG. 14 is a simulated view for explanation of the conventional technology. In FIG. 14, designated at the reference numeral 1 is a laser oscillator, at 2 a laser beam oscillated from the laser beam 1, at 3a, 3b bend mirrors each for bending the laser beam 2 oscillated from the laser oscillator 1, at 4 an image transferring mask having an aperture smaller than that of a diameter of the laser beam in a central section thereof, at 5 a galvano-mirror, at 6 a transmission type of optical component such as an f-θ lens, and at 7 a wiring board as an object to be machined.

In FIG. 14, a laser beam 2 oscillated from the laser scillator 1 is bent by the bend mirror 3a and goes into the image transferring mask 4. At this point of time, the laser beam 2 has a diameter larger than the aperture diameter of the image transferring mask 4 and is taken out by a desired amount of energy or as a desired form of beam through the image transferring mask 4. The laser beam 2 having passed through the image transferring mask 4 is bent by the bend mirror 3b, guided to a specified position of the f-θ lens 6 by the galvano-mirror 5, and also guided to the wiring board 7, whereby a hole is pierced through the wiring board 7.

Figure 15A:
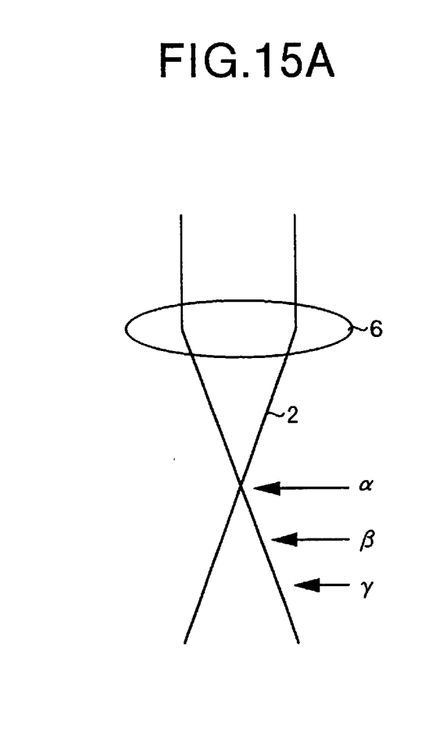
FIGS. 15A to 15C are charts showing changes in beam intensity distribution as well as in a shape of a machined hole caused by defocusing.

It is well known that a laser beam has a different intensity distribution, as indicated by reference signs α, β, γ shown in FIG. 15A, according to a position after the laser beam is passed through the lens. Namely, FIG. 15A shows a laser beam 2 at each of the positions indicated by the reference signs α, β, γ after the beam is passed through the f-θ lens 6, FIG. 15B shows a beam intensity distribution at each of the positions such as at a position indicated by α, namely a focal position, at a position indicated by β, and at a position indicated by γ each shown in FIG. 15A, and FIG. 15C is a view showing a form of a machined hole in the wiring board 7 at each of the positions indicated by α, β, γ shown in FIG. 15A according to each beam intensity.

Generally, in a case where hole-piercing is executed in the wiring board 7, the wiring board 7 is placed at a position indicated by α in FIG. 15A, namely at a focal position. In this case, the intensity distribution of the laser beam 2 is flat as shown in FIG. 15B, and as a result, it is possible to machine a hole with a high degree of roundness and is straight in the direction of the board thickness of the wiring board 7 therein as indicated by α in FIG. 15C.

Figure 15B:
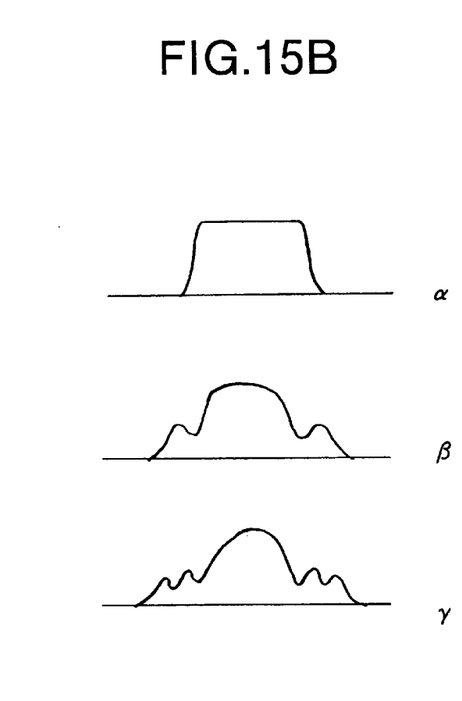
Figure 15C:
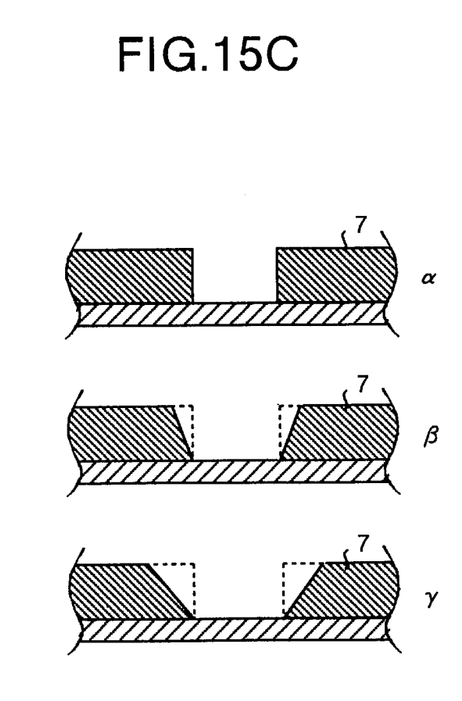

On the other hand, in a case where the wiring board 7 is placed at a position indicated by β in FIG. 15A, this situation is called a defocusing state, and the laser beam 2 is irradiated to the wiring board 7 as indicated by β in FIG. 15B with the intensity distribution thereof like that by the laser beam 2 with reduced converging characteristic, and for this reason it can be recognized that a tapered hole in which the diameter is large in the upper side of the hole and is small in the lower side thereof is formed, as indicated by β in FIG. 15C.

Further, in a case where the wiring board 7 is placed at a position indicated by γ in FIG. 15A, the intensity distribution of the beam is like that by γ in FIG. 15B, and a tapered angle of the machined hole can be increased as indicated by γ in FIG. 15C. As described above, it is possible to easily change a tapered angle of a machined hole according to increase or decrease of a defocusing rate, so that in recent years, this method has become more and more popular and been used for actual industrial purposes.

In a case where the board is machined in the defocusing state, however, a degree of roundness of a machined hole therein is degraded due to astigmatism in a transmission type of optical components such as an f-θ lens or the like.

It is also difficult to vertically adjust the axis of the laser beam after passing through the f-θ lens to the wiring board in the area covering all inciding positions of the laser beam to the f-θ lens, and for this reason, a positional displacement of a machined hole is generated even if the identical position is tried to be machined in a case of machining the hole at the focal position as well as in a case of machining it in the defocusing state. Accordingly, it is required to correct a positional displacement each time when the defocusing rate is changed, which causes increase of needless works.

SUMMARY OF THE INVENTION

It is an object of the present invention to provide a method for machining a wiring board with a laser beam in which the converging characteristic of a laser beam can be changed so that a desired tapered angle can be made in a hole to be machined as well as a device for the same.

A method for machining a wiring board with a laser beam according to the present invention, machines a wiring board by irradiating a laser beam onto a light shielding body provided in a light path between a laser oscillator and a machining lens for shielding a portion of said laser beam, and by introducing a non-shielded portion of said laser beam having passed through said light shielding body to said machining lens.

A device for machining a wiring board with a laser beam according to the present invention, comprises a light shielding body provided in a light path between a laser oscillator and a machining lens for shielding a portion of said laser beam, and a means for introducing a non-shielded portion of said laser beam having passed through said light shielding body to said machining lens.

A device for machining a wiring board with a laser beam according to the present invention, a light shielding body comprises a member which shields a central portion of a laser beam.

A device for machining a wiring board with a laser beam according to the present invention, a light shielding body comprises a member which shields a laser beam in an annular form.

A device for machining a wiring board with a laser beam according to the present invention, a light shielding body comprises a member which can change an area of a laser beam to be shielded.

A device for machining a wiring board with a laser beam according to the present invention, holds a light shielding body by a positioning means movable in the axial direction of a laser beam.

A device for machining a wiring board with a laser beam according to the present invention, comprises a means for changing a diameter of a laser beam inciding into a light shielding body.

A device for machining a wiring board with a laser beam according to the present invention, has the configuration in which a specified area to be shielded, a position of a light shielding body, or a diameter of a laser beam can be adjusted according to an instruction from a control unit.

A device for machining a wiring board with a laser beam according to the present invention, comprises a means for cooling a light shielding body.

A device for machining a wiring board with a laser beam according to the present invention, a light shielding body comprises a laser beam reflecting member with a laser beam damper provided therein.

Other objects and features of this invention will become understood from the following description with reference to the accompanying drawings.

DESCRIPTION OF THE PREFERRED EMBODIMENTS

Figure 1:
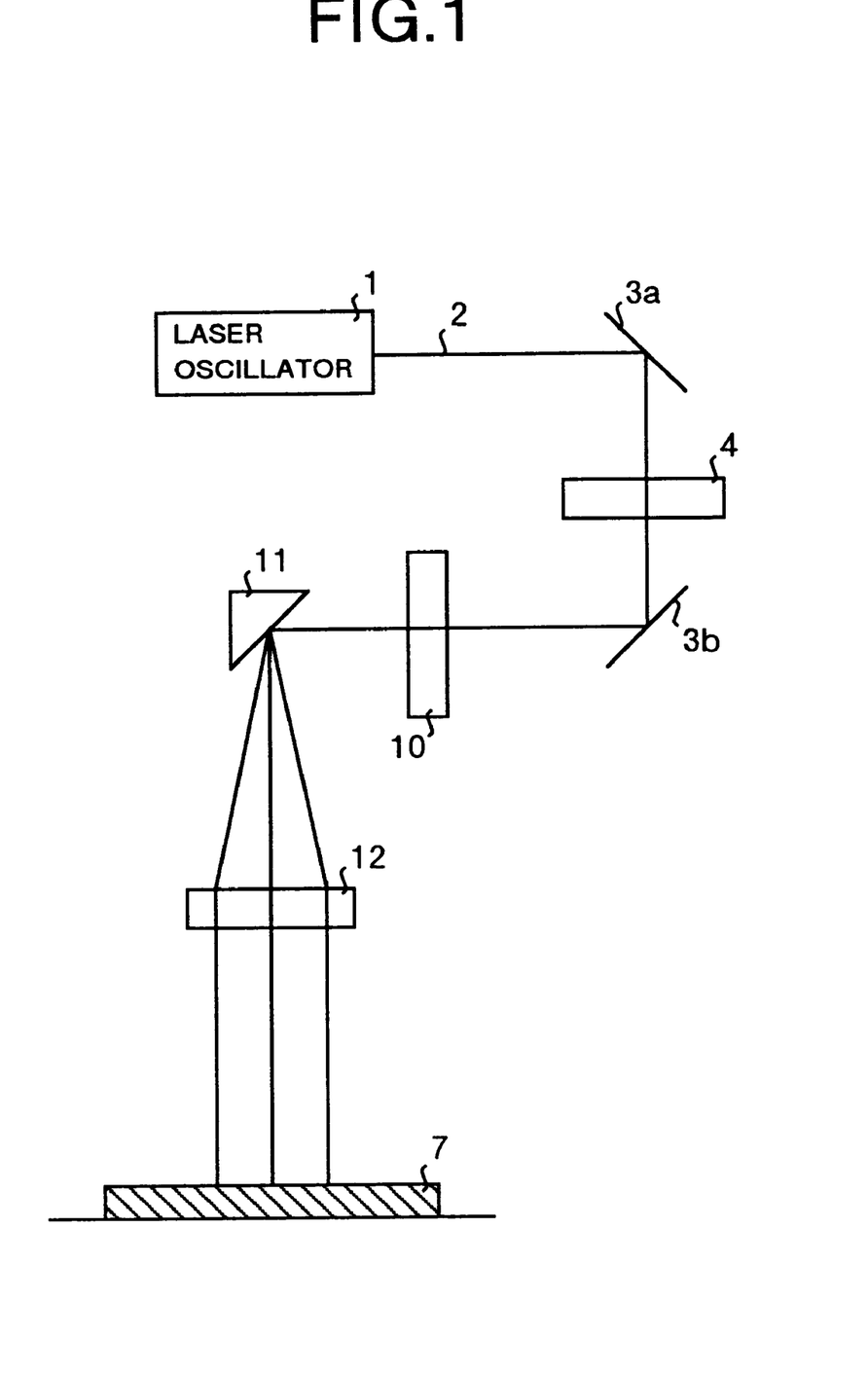
FIG. 1 is a diagrammatic view showing Embodiment 1 of the present invention.

FIG. 1 is a diagrammatic view showing Embodiment 1 of the present invention. In FIG. 1, designated at the reference numeral 1 is a laser oscillator, at 2 a laser beam oscillated from the laser oscillator 1, at 3a, 3b a bend mirror bending the laser beam 2 oscillated from the laser oscillator 1, at 4 an image transferring mask having an aperture smaller than the diameter of the laser beam in the central section therein, at 10 a light shielding body, at 11 a galvano-mirror, at 12 a transmission type of optical component such as an f-θ lens, and at 7 a wiring board as an object to be machined.

In FIG. 1, the embodiment of the present invention has the same processing sequence as that based on the conventional technology in that a laser beam 2 oscillated from the laser oscillator 1 is bent by the bend mirror 3a to pass through the image transferring mask 4 and is bent by the bend mirror 3b. Then, the peripheral portion of the laser beam 2 bent by the bend mirror 3b is shielded by the light shielding body 10, so that the central portion of the laser beam selectively passes therethrough to be incided a specified position of the f-θ lens 12 by the galvano-mirror 11, and then the laser beam is guided to the wiring board 7 to pierce a hole therein.

Figure 2A:
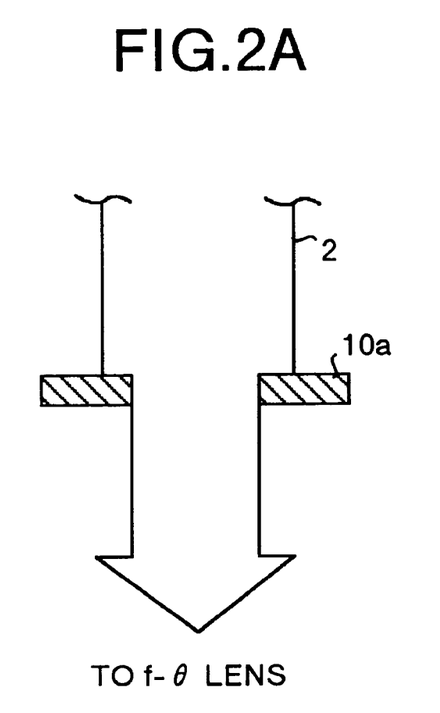
FIGS. 2A and 2B are diagrammatic views showing an example of configuration of a light shielding body used in Embodiment 1.
Figure 2B:
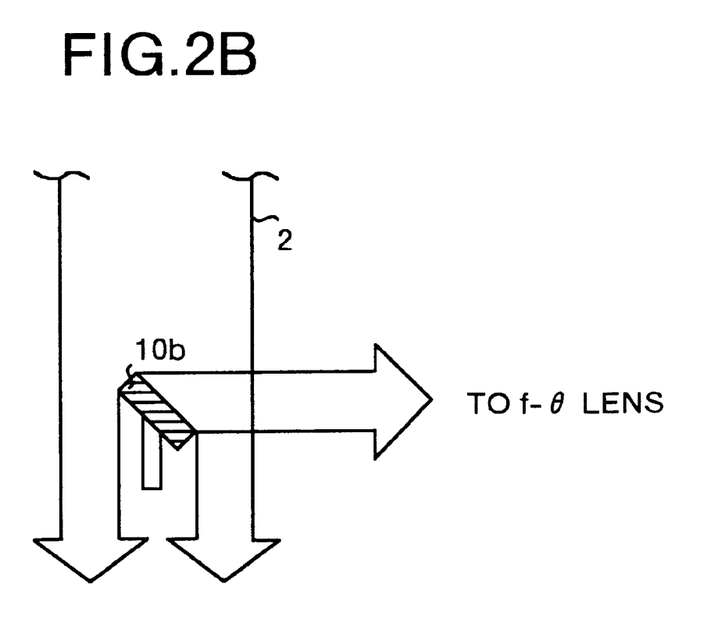

FIGS. 2A and 2B show example of configuration of the light shielding body 10 according to this embodiment, FIG. 2A shows an example of the light shielding body 10 comprising a member 10a having an aperture smaller than the diameter of the laser beam 2 in the central section therein, and FIG. 2B shows an example of the light shielding body 10 comprising a reflecting mirror 10b having a diameter smaller than that of the laser beam 2. Although the combination of the image transferring mask 4, galvano-mirror 11, and f-θ lens 12 was described herein, the combination is not always limited to an image transferring optical system, and the same effect can be obtained even if a converging optical system is employed therefor. Also the combination is not always limited to a scanning optical system comprising, for instance, the galvano-mirror 11 or the like, either.

Figure 3:
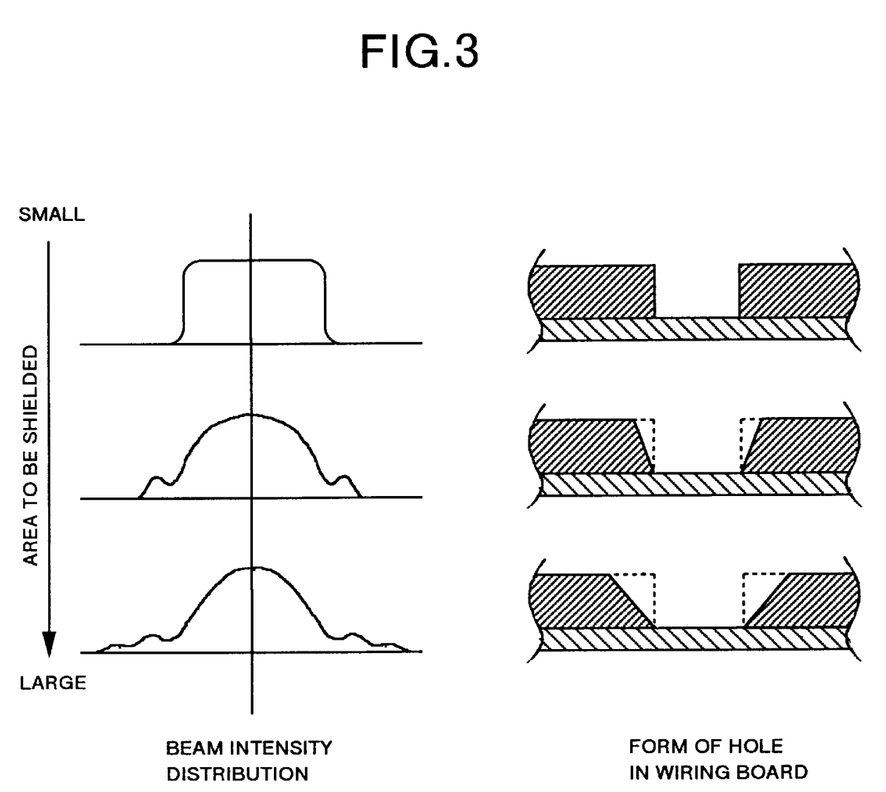
FIG. 3 is a chart showing beam intensity distribution in an area to be shielded and a change in a shape of a machined hole.

FIG. 3 shows a relation among a shielded area of the light shielding body 10, beam intensity distribution formed when a laser beam 2 passes through the f-θ lens 12 to form an image at the focal position, and a form of a pierced hole.

As shown in FIG. 3, the larger the shielded area of the light shielding body 10 becomes, the more the converging characteristic of the laser beam 2 is reduced. This characteristic is equivalent to a relation between defocusing and beam intensity distribution of a laser beam based on the conventional technology, and for this reason, by providing the light shielding body 10 in the configuration, it is possible to form a tapered hole which has a larger diameter in the upper side of the hole as well as a smaller diameter in the lower side thereof in the wiring board 7.

By the way, an example of analogous art to the present invention is disclosed in Japanese Patent Laid-Open Publication No. HEI 7-284976, in which it has been clarified that noise elements at the focus generated when a laser beam is converged are removed by a mask for trapping. However, the object of the invention disclosed therein is to shield the noise elements, which is different from the object of the present invention in which even a portion of the elements supposed to contribute to form an image at the focus in nature is shielded to reduce the converging characteristic of the laser beam.

There is also disclosed an invention in Japanese Patent Laid-Open Publication No. HEI 7-100685, in which a method for machining a hole in a tapered shape by continuously changing an aperture diameter of a mask provided in a light path during irradiation with a laser beam thereonto is disclosed. In the method disclosed therein, it is required to control the aperture diameter of the mask with high-speed and high-precision, which causes the device to be complicated, however, the present invention has such configuration that the converging characteristic of the laser beam itself is changed, so that it is not required to change an area to be shielded during irradiation with the laser beam thereonto if an appropriate area to be shielded required for a desired tapered shape is once set, which makes configuration of the device simpler.

Figure 4A:
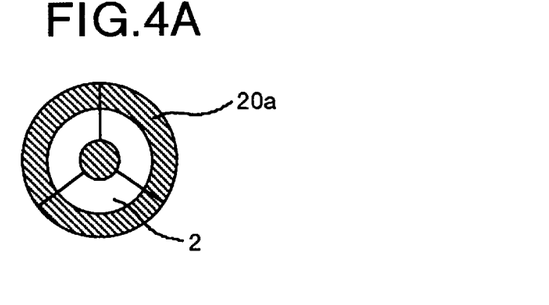
FIGS. 4A to 4C are diagrammatic views showing Embodiment 2 of the present invention.
Figure 4B:
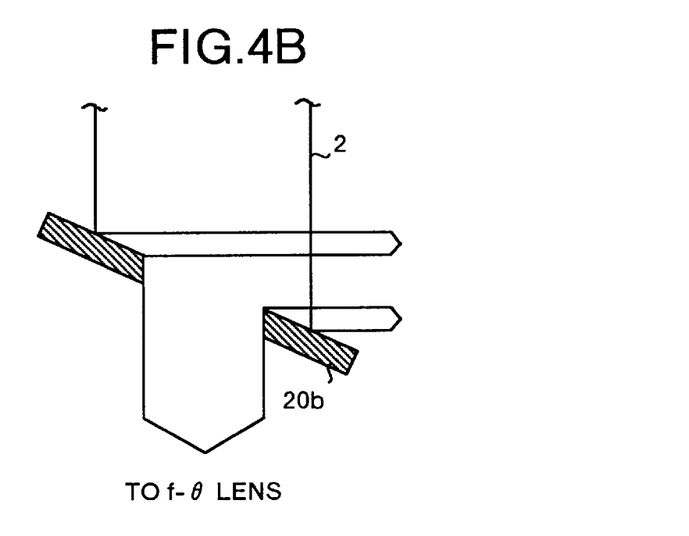
Figure 4C:
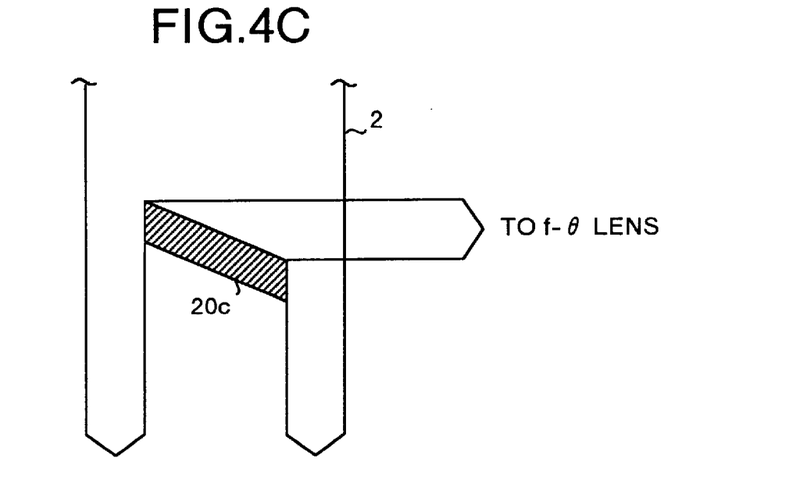

Next, a description is made for Embodiment 2 of the present invention with reference to FIGS. 4A to 4C and FIG. 5. By constructing the light shielding body 10 according to Embodiment 1 shown in FIG. 1 as indicated by the reference numerals 20a to 20c shown in FIG. 4A to FIG. 4C, it is possible to selectively shield the central section of the laser beam 2 as well as to reduce the converging characteristic thereof to form a tapered hole in the wiring board 7. Namely, FIG. 4A shows an example of the light shielding body 20 comprising a member 20a with a doughnut-shaped hole formed therein for letting the laser beam 2 pass through this hole, FIG. 4B shows an example of the light shielding body 20 comprising a reflecting mirror 20b having a larger diameter than that of the laser beam 2 with a hole formed therein having a diameter smaller than that of the laser beam 2 in the central section thereof, and FIG. 4C shows an example of the light shielding body 20 comprising a reflecting mirror 20c having a smaller diameter than that of the laser beam 2.

Figure 5:
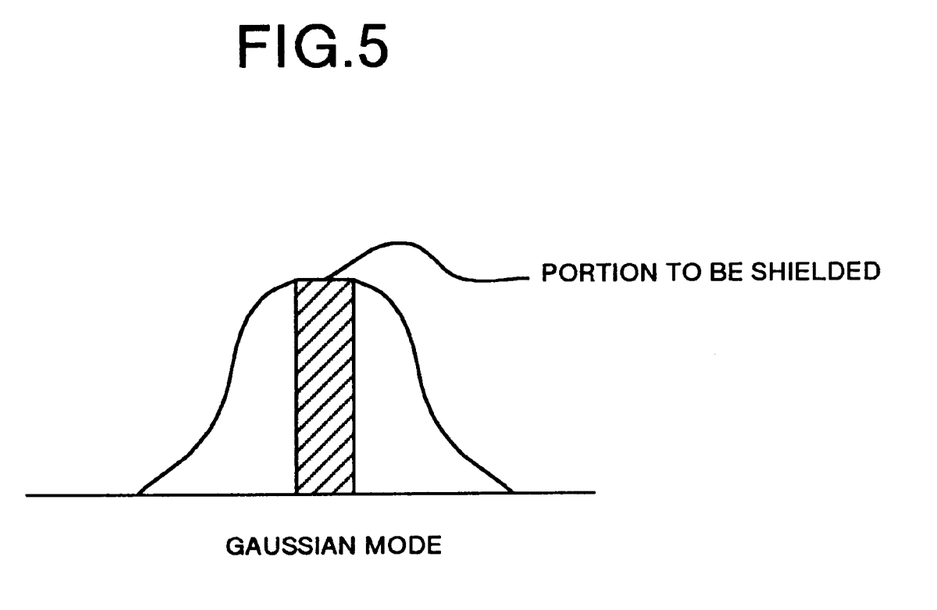
FIG. 5 is a diagrammatic view showing beam intensity distribution in Embodiment 2.

This embodiment is especially effective in a case where the intensity distribution of the laser beam 2 is close to the Gaussian mode shown in FIG. 5, and by slightly shielding the intensive portion in the central portion of the beam intensity distribution, the converging characteristic thereof can remarkably be reduced, which makes it possible to form a tapered hole in the wiring board 7.

Figure 6A:
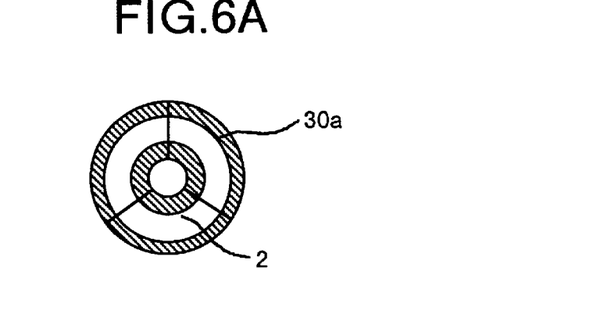
FIGS. 6A to 6C are diagrammatic views showing Embodiment 3 of the present invention.
Figure 6B:
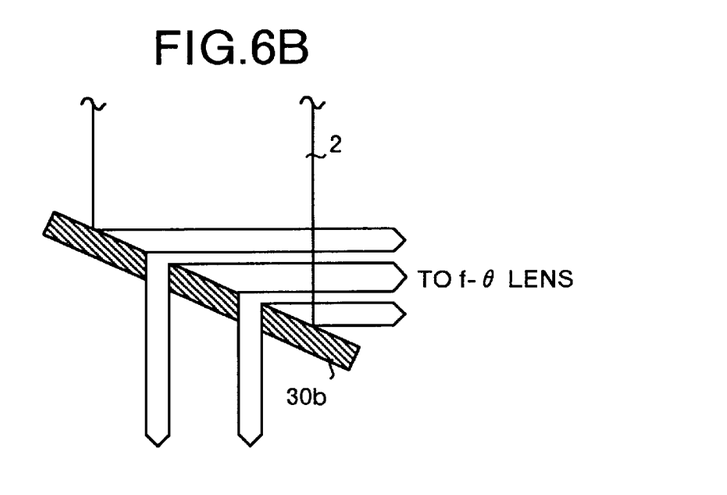
Figure 6C:
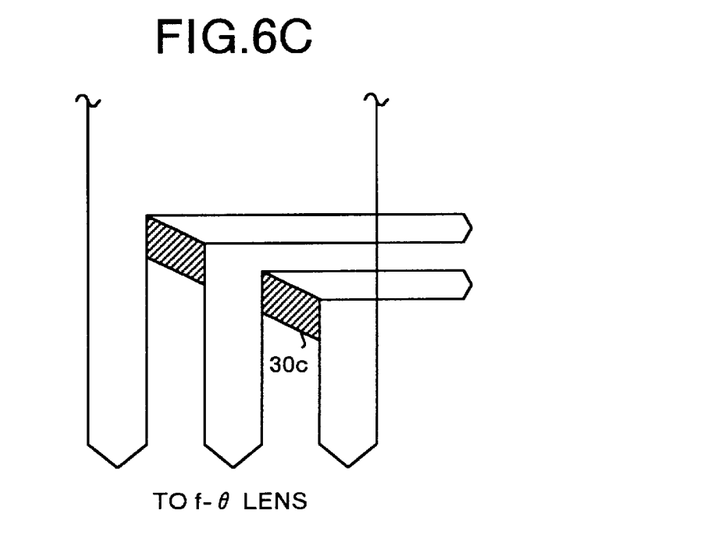

Next description is made for Embodiment 3 of the present invention with reference to FIGS. 6A to 6C and FIG. 7. By constructing the light shielding body 10 according to Embodiment 1 shown in FIG. 1 as indicated by the reference numerals 30a to 30c shown in FIG. 6A to FIG. 6C, it is possible to shield the laser beam 2 in an annular shape as well as to reduce the converging characteristic thereof to form a tapered hole in the wiring board 7. Namely, FIG. 6A shows an example of the light shielding body 30 comprising a member 30a with a double-doughnut-shaped hole formed therein for letting the laser beam 2 pass through the hole, FIG. 6B shows an example of the light shielding body 30 comprising a reflecting mirror 30b having a larger diameter than that of the laser beam 2 with double holes formed therein each having a diameter smaller than that of the laser beam 2 in the central section thereof, and FIG. 6C shows an example of the light shielding body 30 comprising a reflecting mirror 30c having a smaller diameter than that of the laser beam 2 with a hole formed in the central section therein.

Figure 7:
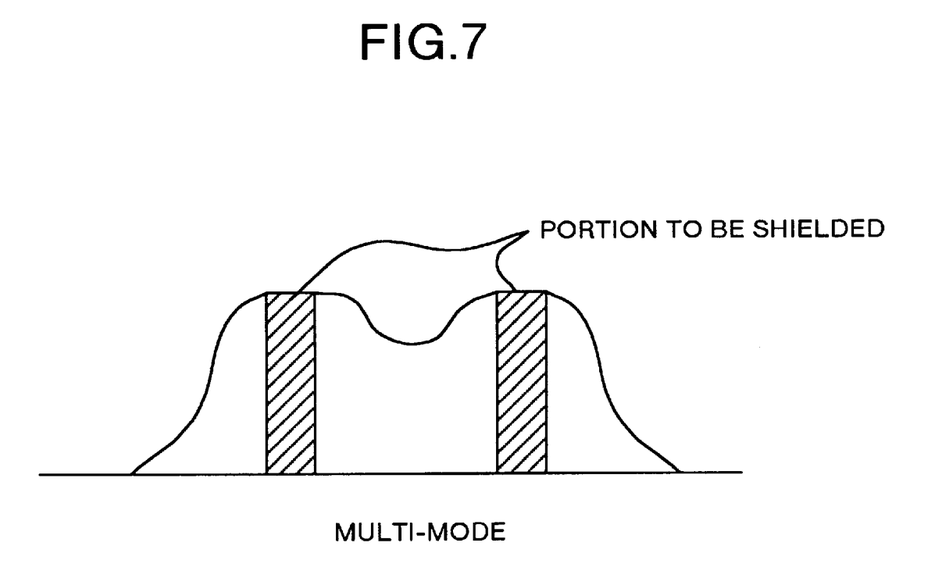
FIG. 7 is a diagrammatic view showing a beam intensity distribution in Embodiment 3.

This embodiment is especially effective in a case where the intensity distribution of the laser beam 2 is close to the multi-mode shown in FIG. 7, and by slightly shielding the intensive portions of the beam intensity distribution, the converging characteristic thereof can remarkably be reduced, which makes it possible to form a tapered hole in the wiring board 7.

Figure 8A:
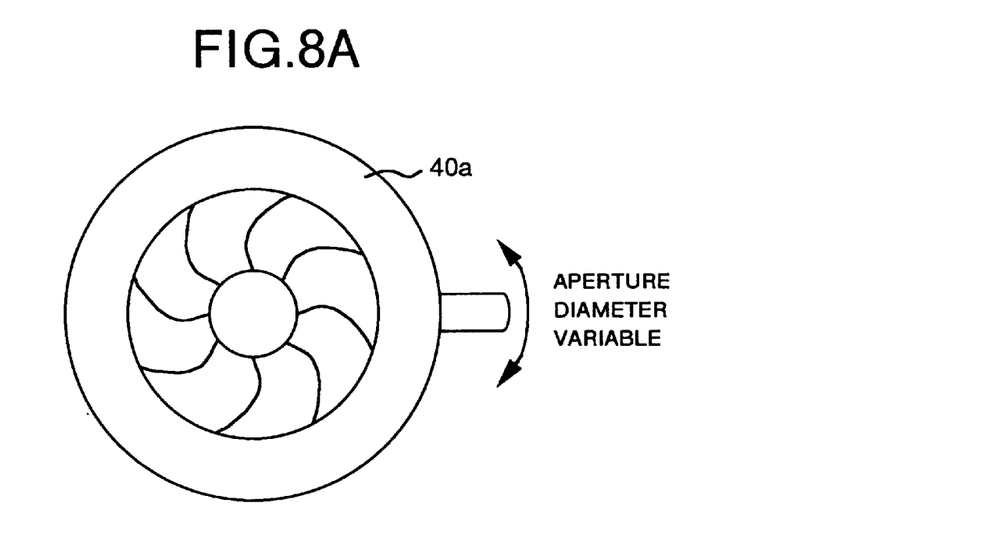
FIGS. 8A and 8B are diagrammatic views showing Embodiment 4 of the present invention.
Figure 8B:
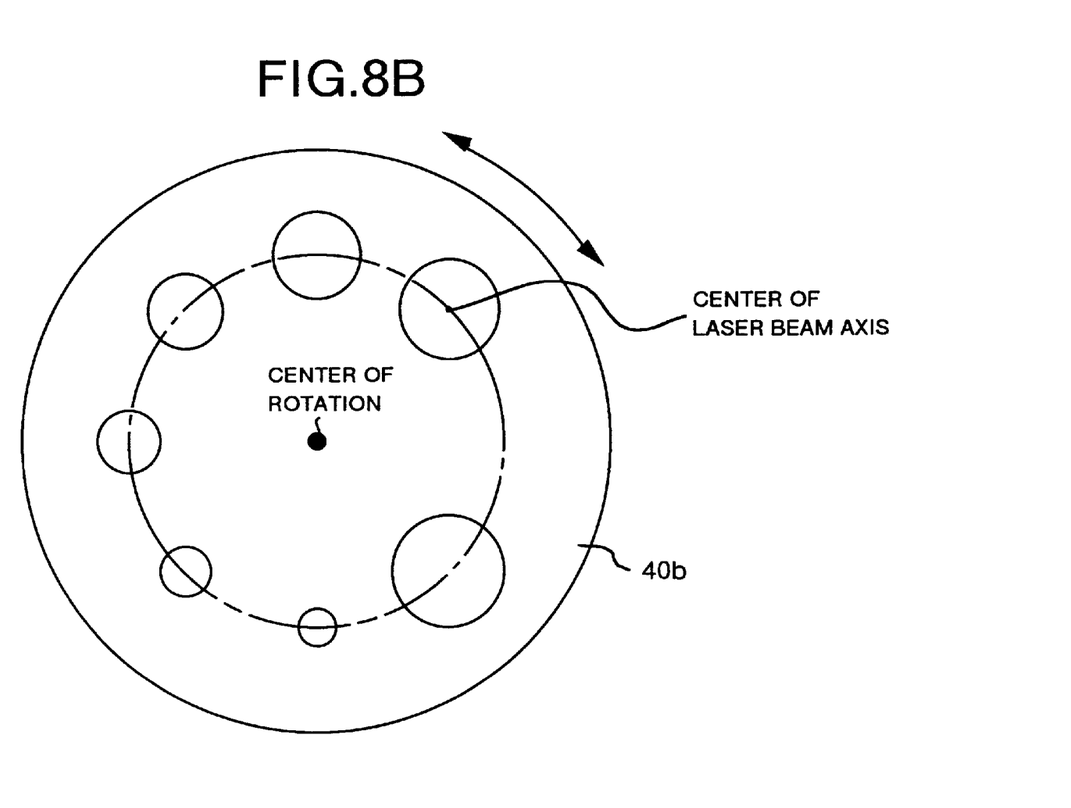

Next description is made for Embodiment 4 of the present invention with reference to FIGS. 8A and 8B. In Embodiment 4, the light shielding body 10 according to Embodiment 1 shown in FIG. 1 comprises a light shielding body 40 comprising a member 40a as an iris stop mechanism with a manually variable aperture diameter as shown in FIG. 8A or a rotary disk mechanism 40b with a plurality of holes each having a different diameter thereof concentrically provided therein as shown in FIG. 8B or the like so that an area of the laser beam 2 to be shielded can be changed, and for this reason it is possible to easily change the converging characteristic of the laser beam 2 continuously or intermittently. Namely, it is possible to change a tapered angle of a hole to be machined in the wiring board 7 continuously or intermittently.

Although the light shielding body 40 according to Embodiment 4 shown in FIGS. 8A and 8B enables manual change of an area to be shielded, the area to be shielded can be controlled from the control unit by providing a driving mechanism such as a stepping motor or the like, a driving force delivery mechanism comprising a gear or the like, or a communicating means with the control unit in the configuration.

Figure 9:
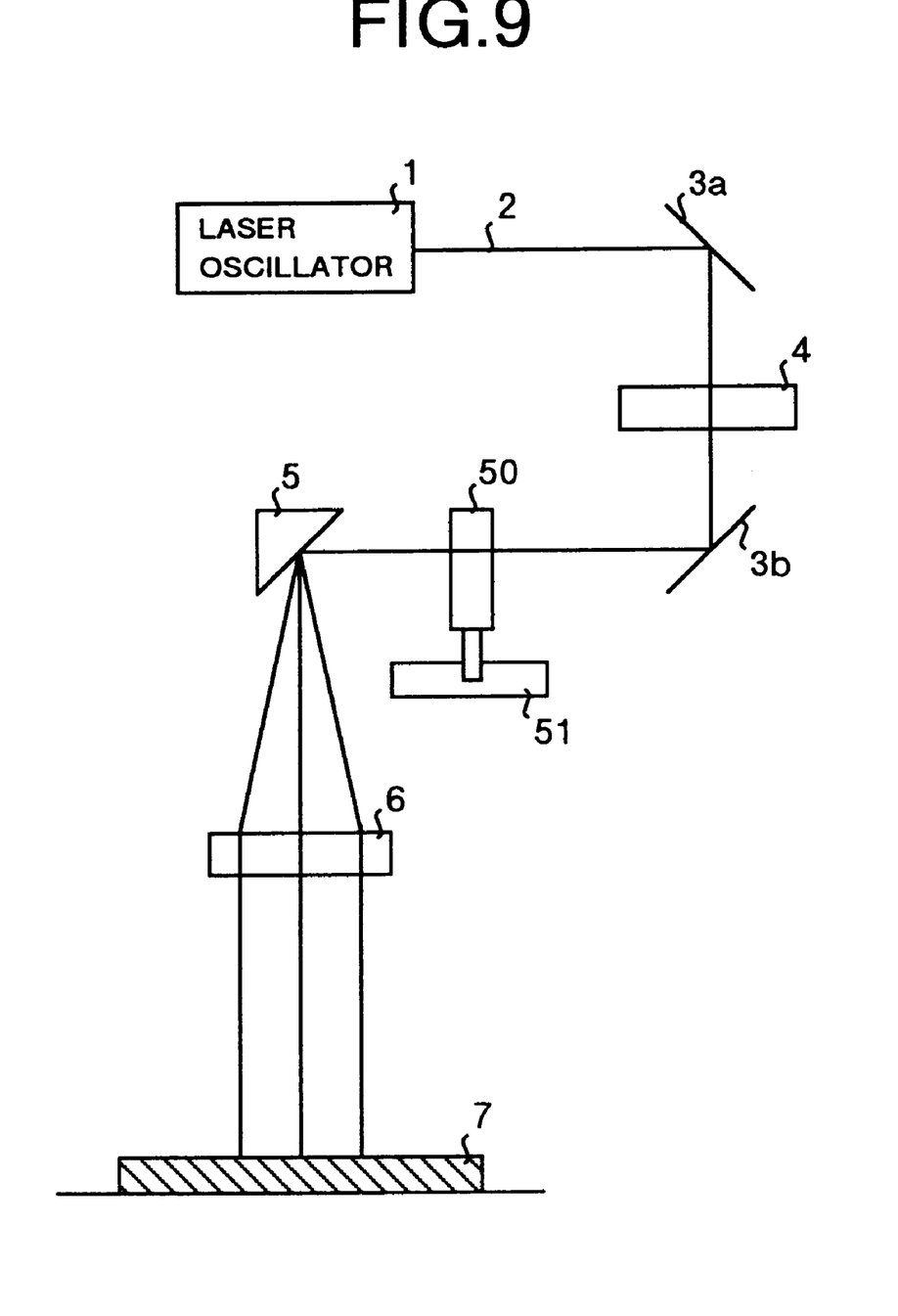
FIG. 9 is a diagrammatic view showing Embodiment 5 of the present invention.

Next description is made for Embodiment 5 of the present invention with reference to FIG. 9. FIG. 9 is a diagrammatic view showing Embodiment 5 of the present invention, and the embodiment is different from Embodiment 1 shown in FIG. 1 in that a light shielding body 50 can manually be positioned in the axial direction of the laser beam 2 by a positioning means such as a positioning rail 51 or the like. Namely, the laser beam 2 is gradually diverged after passing through the image transferring mask 4, and the diameter of the laser beam 2 becomes larger in accordance with the movement from the image transferring mask 4 to the galvano-mirror 5.

Accordingly, if the light shielding body 50 does not have a means for changing an area to be shielded but has an appropriate area to be shielded, by moving the light shielding body 50 to-and-fro in the axial direction of the laser beam on the positioning rail 51, it is possible to obtain the effect equivalent to that obtained by changing an area to be shielded. It should be noted that other points are the same as those in Embodiment 1, so that description thereof is omitted herein.

It should be noted that, in Embodiment 5, the light shielding body 50 is manually positioned, but it can be positioned from the control unit by providing a well-known linear driving mechanism comprising feed screws and a linear guide or the like and a communicating means with the control unit in the configuration.

Figure 10:
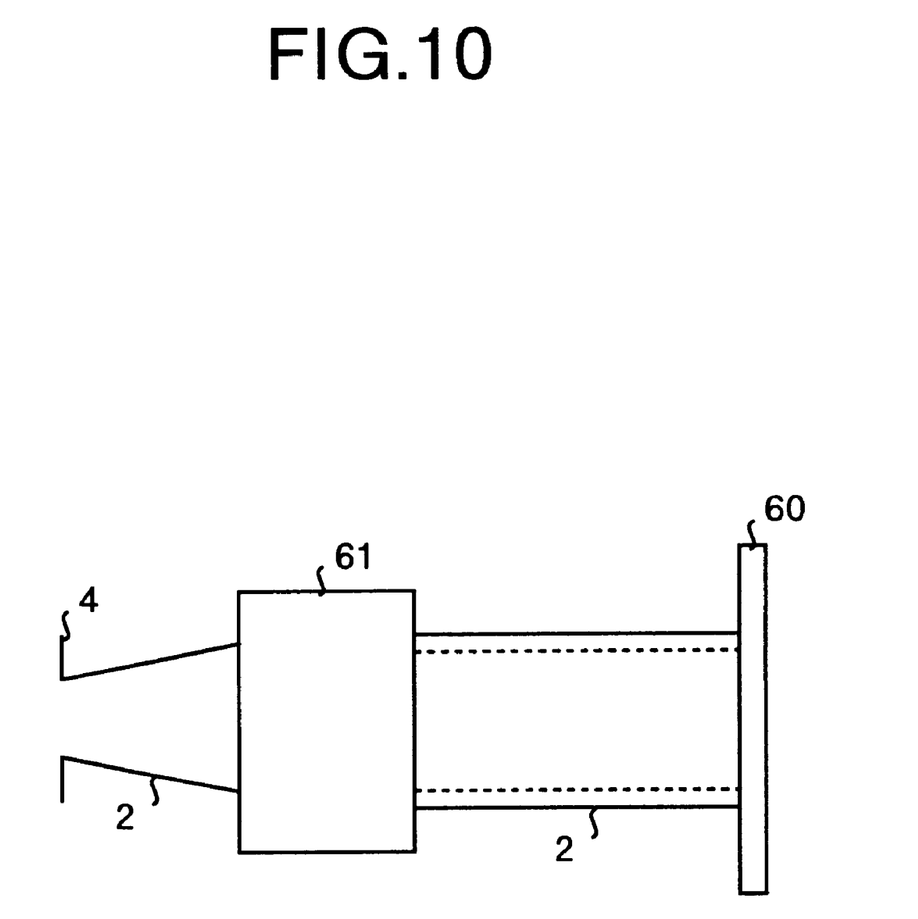
FIG. 10 is a diagrammatic view showing Embodiment 6 of the present invention.

Next, a description is made for Embodiment 6 of the present invention with reference to FIG. 10. FIG. 10 is a simulated view showing the sixth embodiment of the present invention. In this embodiment, a beam diameter adjusting device 61 based on a combination with a transmission type of optical components or with reflecting type of optical components is provided in front of a light shielding body 60. Accordingly, if the light shielding body 60 does not have a means for changing an area to be shielded but has an appropriate area to be shielded, by changing a diameter of an inciding beam to the light shielding body 60 with the beam diameter adjusting device 61, the converging characteristic of the laser beam 2 can be changed.

Figure 11A:
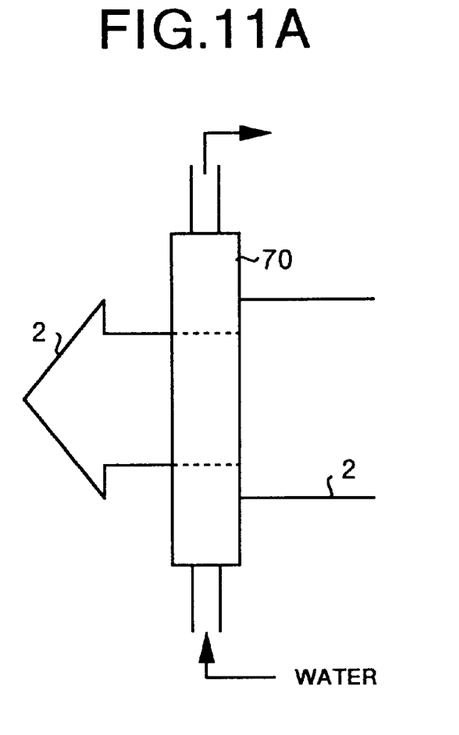
FIGS. 11A and 11B are diagrammatic views showing Embodiment 7 of the present invention.
Figure 11B:
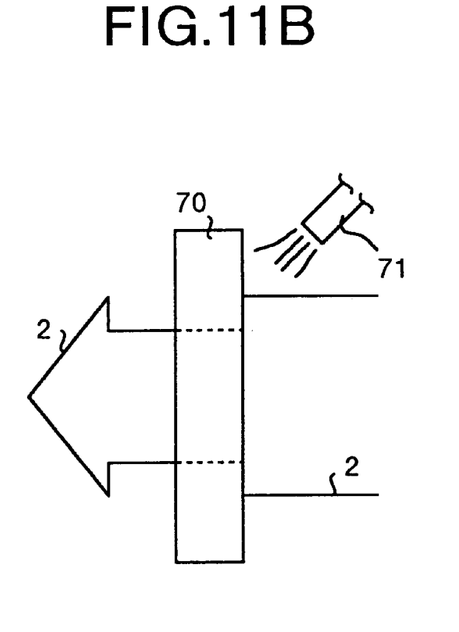

Next, a description is made for Embodiment 7 of the present invention with reference to FIGS. 11A and 11B. FIGS. 11A and 11B are diagrammatic views showing Embodiment 7 of the present invention. A light shielding body 70 is deformed or damaged due to heat generated by absorbing thereinto the laser beam 2 shielded by the body itself. In this embodiment, deformation or damage thereof is prevented by cooling the light shielding body 70 so that the function thereof can be performed with stability for a long period of time. More specifically, there are methods for cooling the body with water by providing a cooling water passage inside the aperture 70 as shown in FIG. 11A as well as for cooling the light shielding body 70 by applying clean gas thereonto from a nozzle 71 to be air-cooled as shown in FIG. 11B or some other method.

Figure 12:
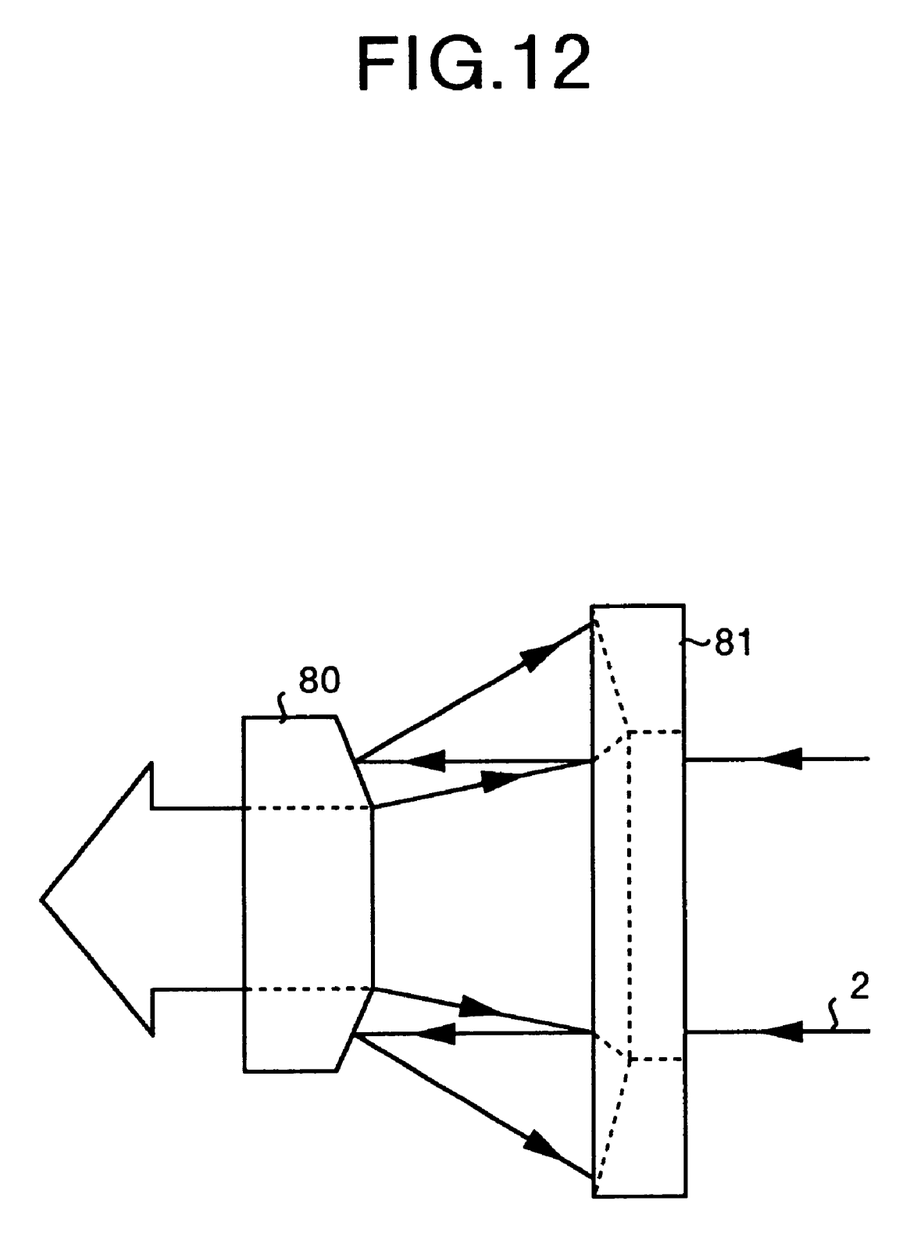
FIG. 12 is a diagrammatic view Embodiment 8 of the present invention.

Next, a description is made for Embodiment 8 of the present invention with reference to FIG. 12. FIG. 12 is a diagrammatic view showing Embodiment 8 of the present invention. A light shielding body 80 is deformed or damaged due to heat generated by absorbing thereinto the laser beam 2 shielded by the body itself. In this embodiment, a laser beam inciding side of the light shielding body 80 is a reflecting mirror according to a method of metal deposition or the like, whereby an absorbing rate of the laser beam by the light shielding body 80 is reduced, and for this reason, the heat generated therein can be suppressed to a low level, which makes it possible to suppress the deformation or the damage of the light shielding body 80. By providing a laser beam damper 81 in the configuration so as to absorb the laser beam 2 reflected by the light shielding body 80, a laser machining device can more stably be operated.

Figure 13:
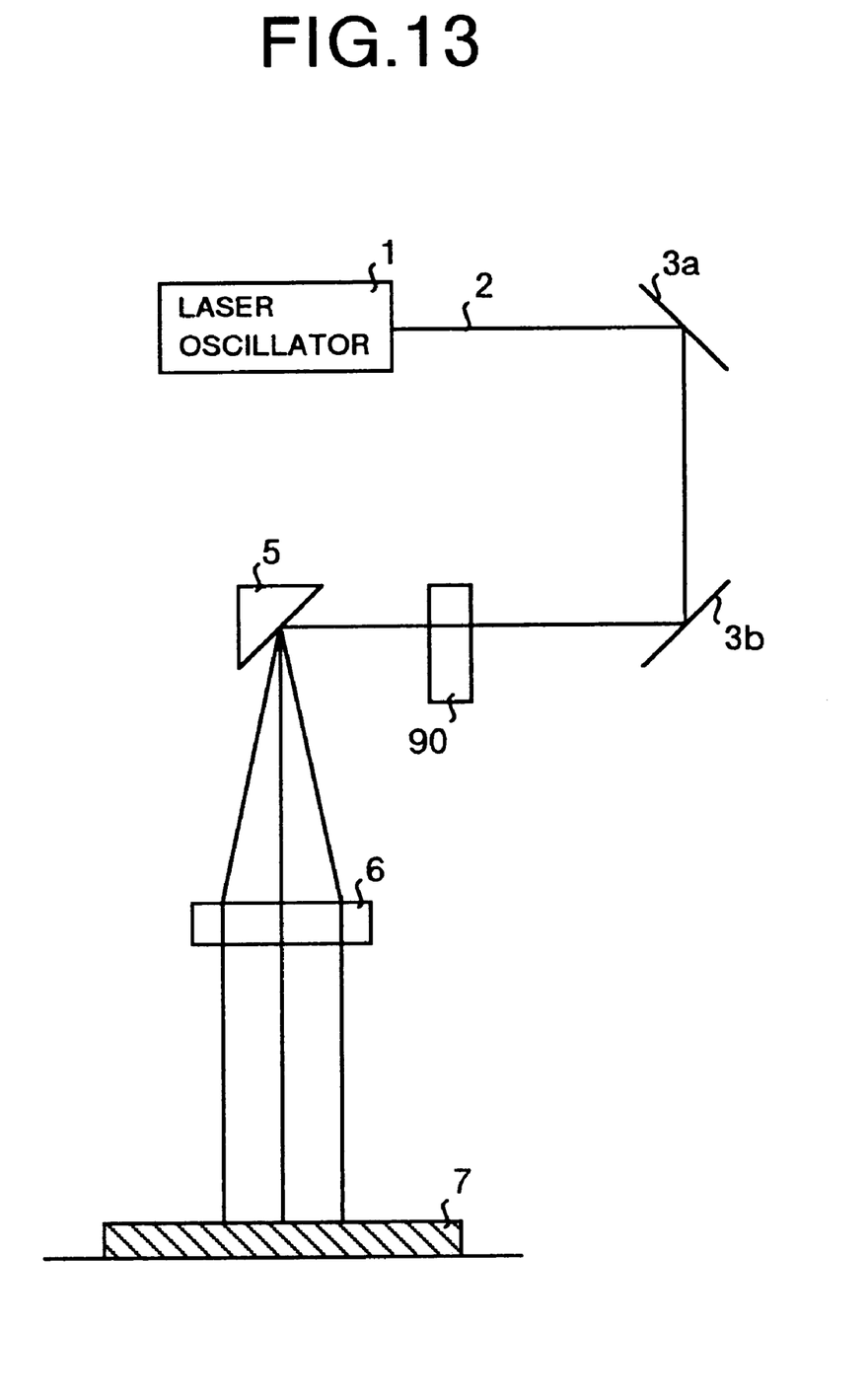
FIG. 13 is a diagrammatic view showing Embodiment 9 of the present invention.

Next, a description is made for Embodiment 9 of the present invention with reference to FIG. 13. FIG. 13 is a diagrammatic view showing Embodiment 9 of the present invention. In the description made above, the embodiment in the image transferring optical system having the image transferring mask 4 is described, but the present invention is not limited to the image transferring optical system. FIG. 13 shows configuration in which a light shielding body 90 is provided in the converging optical system not having the image transferring mask. It should be noted that other points therein are the same as those in each of the embodiments described above, so that description thereof is omitted herein.

Description has been made for each of Embodiments 1 to 9 with the related drawings, and it is also possible to achieve the object as well as effects of the present invention by combining the embodiments with each other. Various types of combination can be employed, for instance, by applying a device obtained by combining the light shielding body 50 and the positioning rail 51 according to Embodiment 5 each described in FIG. 9 in place of the light shielding body 10 according to Embodiment 1 described in FIG. 1.

In the present invention, a light shielding body is provided in a light path between a laser oscillator and a machining lens for shielding a portion of said laser beam, said laser beam is irradiated onto this light shielding body, a non-shielded portion of said laser beam having passed through said light shielding body is introduced to said machining lens, whereby the converging characteristic of the laser beam can be changed, which makes it possible to provide a taper in the wall surface of a machined hole at a position of a focal point without defocusing. Thus, it is possible to obtain a method of and a device for machining a wiring board with a laser beam in which a degree of roundness of the machined hole is not lowered by astigmatism of a transmission type of an optical component such as a f-θ lens generated in a case where machining is executed in a state of defocusing, and correction of a position required in the conventional technology whenever defocusing volume is changed is not required.

In the present invention, a light shielding body comprises a member which shields a central portion of a laser beam, and the converging characteristic of the laser beam can be changed, whereby, in a case where intensity distribution of the laser beam is close to Gaussian mode, the converging characteristic can easily be lowered and a taper hole can be generated on a wiring board by shielding a very small portion of the laser beam having intense beam intensity distribution in the center thereof.

In the present invention, the light shielding body comprises a member which shields a laser beam in an annular shape, and the converging characteristics of the laser beam can be changed, whereby, in a case where intensity distribution of the laser beam is close to multi-mode, the converging characteristic can easily be lowered and a taper hole can be generated on a wiring board by shielding a very small portion of the laser beam having intense beam intensity distribution.

In the present invention, a light shielding body comprises a member which can change an area of a laser beam to be shielded, whereby the converging characteristics of the laser beam can easily be changed. Thus, a taper angle for a wall surface of a machined hole can easily be changed.

In the present invention, the light shielding body is held by a positioning means movable in the axial direction of a laser beam, whereby the converging characteristics of the laser beam can be changed with simple configuration. Namely, a taper angle for a wall surface of a machined hole can easily changed easily with high reliability.

The present invention comprises a means for changing a diameter of a laser beam inciding into a light shielding body, whereby the converging characteristics of the laser beam can easily be changed with simple configuration. Namely, a taper angle for a wall surface of a machined hole can easily be changed with high reliability.

The present invention has the configuration in which a specified area to be shielded, a position of a light shielded body, or a diameter of a laser beam can be adjusted according to an instruction from a control unit, whereby the operations can be automated with the productivity improved.

The present invention comprises a means for cooling a light shielding body, whereby rise of a temperature of the light shielding body by absorbing a laser beam having been shielded is small and the operations can be executed stably for a long period.

In the present invention, the light shielding body comprises a laser beam reflecting member with a laser beam damper provided therein, whereby rise of a temperature of the light shielding body by absorbing a laser beam having been shielded is small and the operations can be executed stably for a long period.

This application is based on Japanese patent application No. HEI 8-260847 filed in the Japanese Patent Office on Oct. 1, 1996, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method for machining a wiring board with a laser beam for drilling holes in the wiring board with the laser beam oscillated from a laser oscillator, comprising the steps of:

irradiating said laser beam onto a light shielding body provided for shielding a portion of said laser beam provided in a light path between said laser oscillator and a machining lens;

setting converging characteristics of said laser beam thereby setting a tapering degree of a wall surface of a hole to be drilled and maintaining said converging characteristics throughout the machining;

machining said wiring board by introducing a non-shielded portion of said laser beam having passed through said light shielding body to said machining lens;

wherein said tapering degree of the wall surface of a drilled hole is selectively set prior to machining by changing the converging characteristics of said laser beam with said light shielding body.

\* \* \* \* \*